(12) United States Patent
Takeshita

(10) Patent No.: US 10,812,042 B2
(45) Date of Patent: Oct. 20, 2020

(54) ELECTRONIC COMPONENT

(71) Applicant: Murata Manufacturing Co., Ltd., Nagaokakyo-shi, Kyoto-fu (JP)

(72) Inventor: Toru Takeshita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 701 days.

(21) Appl. No.: 15/673,443

(22) Filed: Aug. 10, 2017

(65) Prior Publication Data

US 2017/0338797 A1 Nov. 23, 2017

Related U.S. Application Data

(63) Continuation of application No. PCT/JP2016/059615, filed on Mar. 25, 2016.

(30) Foreign Application Priority Data

Mar. 27, 2015 (JP) ................. 2015-066207

(51) Int. Cl.
| | |
|---|---|
| *H03H 9/25* | (2006.01) |
| *H01L 41/053* | (2006.01) |
| *H03H 9/145* | (2006.01) |
| *H03H 9/10* | (2006.01) |
| *H01L 41/22* | (2013.01) |

(52) U.S. Cl.
CPC ........... *H03H 9/145* (2013.01); *H01L 41/053* (2013.01); *H03H 9/1071* (2013.01); *H03H 9/25* (2013.01); *H01L 41/22* (2013.01)

(58) Field of Classification Search
CPC ........ H03H 9/145; H03H 9/1071; H03H 9/25; H01L 41/053; H01L 41/22

USPC .......................... 310/313 R, 313 D, 340, 348
See application file for complete search history.

(56) References Cited

U.S. PATENT DOCUMENTS

| | | | |
|---|---|---|---|
| 2015/0141827 A1* | 5/2015 | Kiyose | A61B 8/4427 600/443 |
| 2018/0102757 A1* | 4/2018 | Fukushima | H03H 9/02992 |

FOREIGN PATENT DOCUMENTS

| | | |
|---|---|---|
| JP | 2004-336671 A | 11/2004 |
| JP | 2007-019943 A | 1/2007 |
| JP | 2007-129002 A | 5/2007 |
| JP | 2007-318058 A | 12/2007 |
| JP | 2008-005241 A | 1/2008 |
| JP | 2014-072607 A | 4/2014 |

(Continued)

OTHER PUBLICATIONS

Official Communication issued in Korean Patent Application No. 10-2017-7025987, dated Aug. 21, 2018.

(Continued)

*Primary Examiner* — Thomas M Dougherty
(74) *Attorney, Agent, or Firm* — Keating & Bennett, LLP

(57) ABSTRACT

In an electronic component, electrodes defining functional portions are provided on a piezoelectric substrate. In order to define a hollow portion which the functional portions face, there are provided a first support with a frame shape, and second supports on the piezoelectric substrate in an inner side region surrounded by the first support. A cover is laminated on the first support as well as on the second supports to define the hollow portion. A height of each of the second supports is higher than a height of the first support.

20 Claims, 7 Drawing Sheets

(56) References Cited

FOREIGN PATENT DOCUMENTS

JP    2014-146896 A    8/2014

OTHER PUBLICATIONS

Official Communication issued in International Patent Application No. PCT/JP2016/059615, dated Jun. 14, 2016.

* cited by examiner

ELECTRONIC COMPONENT

CROSS REFERENCE TO RELATED APPLICATIONS

This application claims the benefit of priority to Japanese Patent Application No. 2015-066207 filed on Mar. 27, 2015 and is a Continuation application of PCT Application No. PCT/JP2016/059615 filed on Mar. 25, 2016. The entire contents of each application are hereby incorporated herein by reference.

BACKGROUND OF THE INVENTION

1. Field of the Invention

The present invention relates to electronic components such as surface acoustic wave devices and the like, for example.

2. Description of the Related Art

A package structure including a hollow portion is employed for surface acoustic wave devices and the like. For example, in an electronic component package disclosed in Japanese Unexamined Patent Application Publication No. 2007-129002, a plurality of electronic component elements are disposed on a component substrate. Partition walls for partitioning the plurality of electronic component elements from each other are provided. On the partition walls, a cover to constitute a hollow portion is provided.

Meanwhile, in a surface acoustic wave device disclosed in Japanese Unexamined Patent Application Publication No. 2007-19943, an IDT electrode is formed on a lower surface of a piezoelectric substrate. In order to seal a portion where the IDT electrode is formed, an annular side wall and a cover unit sealing a cavity of the annular side wall are provided. Further, a sealing film is laminated on an outer surface of the cover unit. A protective resin portion is so provided as to cover the sealing film. The protective resin portion is extended to an outer side portion relative to the cover unit, and is also extended to the piezoelectric substrate side in the outer side portion of the cover unit.

In the structure, as disclosed in Japanese Unexamined Patent Application Publication No. 2007-129002 and Japanese Unexamined Patent Application Publication No. 2007-19943, in which a hollow portion is constituted by using a cover, a cover unit, or the like, a mold resin layer is further provided in an outer side portion in many cases. With such structure, heat is likely to accumulate inside thereof. As such, there is a problem that frequency temperature characteristics are likely to be degraded.

In addition, due to inflow-pressure of the resin at a time of molding, there is a risk that the cover, the cover unit, or the protective resin portion described in Japanese Unexamined Patent Application Publication No. 2007-19943 is so deformed as to project toward the piezoelectric substrate side in a center region of the hollow portion. In the case where an amount of deformation becomes large, there is a risk of the cover, the cover unit, or the like making contact with the IDT electrode or the like.

SUMMARY OF THE INVENTION

Preferred embodiments of the present invention provide electronic components that achieve improved heat dissipation properties and significantly reduce or prevent deformation of a cover at the time of forming a mold resin layer.

An electronic component according to a preferred embodiment of the present invention includes a piezoelectric substrate, an electrode that is provided on the piezoelectric substrate and defines a functional portion, a first support having a frame shape and provided on the piezoelectric substrate so as to define a hollow portion which the functional portion faces, a second support provided on the piezoelectric substrate in an inner side region surrounded by the first support, and a cover that is laminated on the first and second supports and defines the hollow portion, wherein a height of the second support is higher than a height of the first support.

In an electronic component according to a preferred embodiment of the present invention, a plurality of second supports are provided.

In another electronic component according to a preferred embodiment of the present invention, heights of the plurality of second supports are equal or substantially equal to one another (i.e., within manufacturing tolerances).

In another electronic component according to a preferred embodiment of the present invention, the height of at least one of the second supports is different from the height of each of the other second supports.

In still another electronic component according to a preferred embodiment of the present invention, at least one of the second supports includes a plurality of material layers.

In another electronic component according to a preferred embodiment of the present invention, at least a portion of the first support is made of metal.

In still another electronic component according to a preferred embodiment of the present invention, the electronic component further includes a bonding member provided on the first support.

In still another electronic component according to a preferred embodiment of the present invention, a height of an uppermost portion of the cover is lower than a height of an upper end of the bonding member.

In another electronic component according to a preferred embodiment of the present invention, the height of the uppermost portion of the cover is higher than the height of the upper end of the bonding member.

In yet another electronic component according to a preferred embodiment of the present invention, the first support and the second support are made of different materials from each other.

In another electronic component according to a preferred embodiment of the present invention, at least one IDT electrode is provided in the functional portion so as to define a surface acoustic wave device.

According to electronic components of preferred embodiments of the present invention, the deformation of the cover is unlikely to occur even if sealing with resin is carried out. In addition, heat dissipation properties thereof are efficiently improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified through the description of specific preferred embodiments of the present invention with reference to the drawings.

It is to be noted that the preferred embodiments described in the present specification are merely examples and replacement or combination of the configurations can be partially made between different preferred embodiments.

Figure 1:
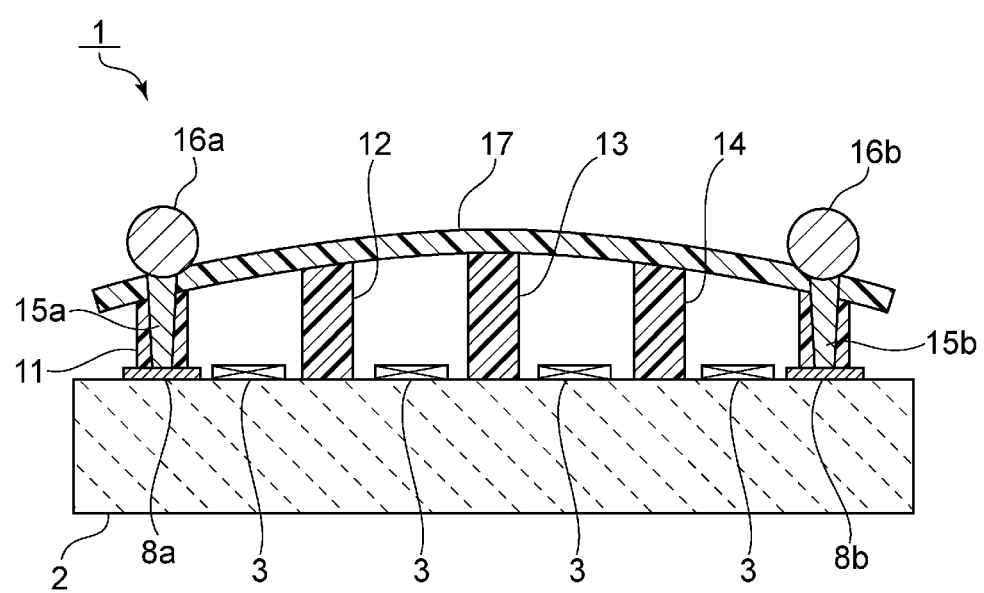
FIG. 1 is a cross-sectional side view of an electronic component according to a first preferred embodiment of the present invention, and is a cross-sectional view of a portion corresponding to a portion taken along an A-A line in FIG. 2.
Figure 2:
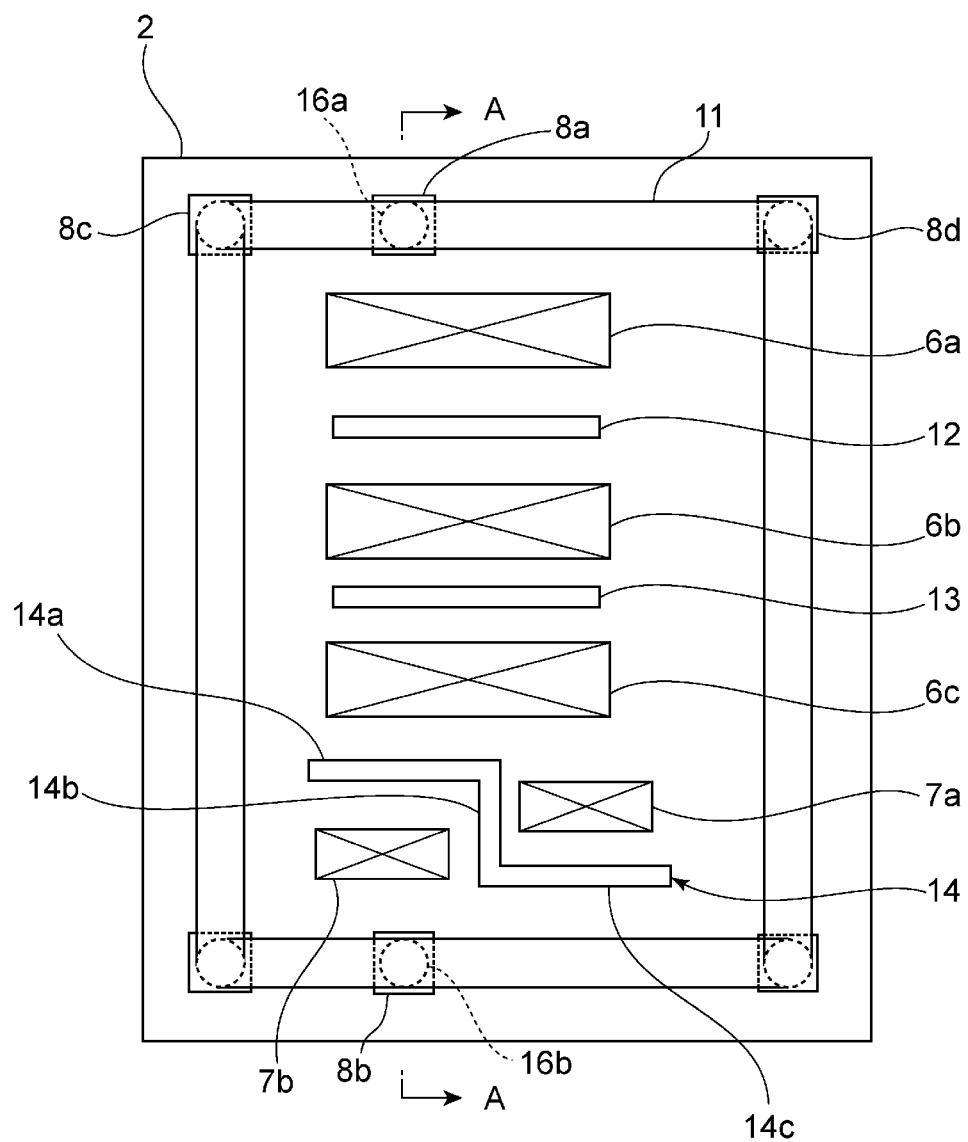
FIG. 2 is a plan view illustrating a state where a cover is removed in the electronic component according to the first preferred embodiment of the present invention.

FIG. 1 is a cross-sectional side view of an electronic component according to a first preferred embodiment of the present invention, and FIG. 2 is a plan view illustrating a state where a cover to be explained later is removed in the electronic component according to the first preferred embodiment.

Note that FIG. 1 is a cross-sectional view of a portion corresponding to a portion taken along an A-A line in FIG. 2.

As shown in FIG. 1, an electronic component 1 includes a piezoelectric substrate 2. The piezoelectric substrate 2 preferably is formed of a 42° Y cut X SAW propagation LiTaO$_3$ substrate, for example. Note that, however, the material of the piezoelectric substrate 2 is not limited thereto. LiTaO$_3$ of another orientation may be used, or another piezoelectric single crystal such as LiNbO$_3$ or the like may be used. Further, piezoelectric ceramics may be used.

Figure 3:
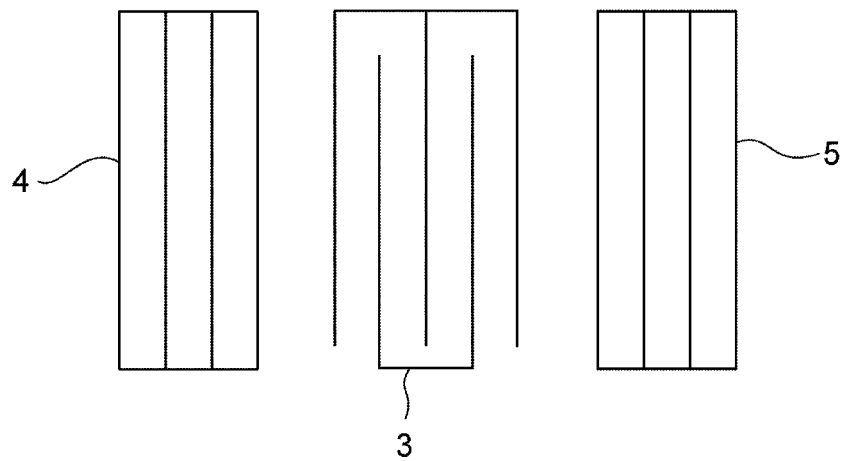
FIG. 3 is a schematic plan view illustrating an electrode structure of a surface acoustic wave resonator of the first preferred embodiment of the present invention.

A plurality of IDT electrodes 3 defining functional portions are provided on a first principal surface of the piezoelectric substrate 2, which has the first principal surface and a second principal surface opposing each other. In reality, as illustrated in a schematic plan view in FIG. 3, reflectors 4 and 5 are provided on both sides of the IDT electrode 3 in a surface acoustic wave propagation direction. With this, a surface acoustic wave resonator is provided. In order to adjust an electromechanical coupling coefficient, a dielectric film may be provided between the plurality of IDT electrodes 3 and the first principal surface of the piezoelectric substrate.

Note that in FIG. 2, a portion where a single surface acoustic wave resonator is provided is indicated using a symbol in which an "X" mark is enclosed by a rectangle. That is, as shown in FIG. 2, surface acoustic wave resonators 6a to 6c, 7a, and 7b are provided. Note that in FIG. 1, the IDT electrodes 3 located in the portions where the surface acoustic wave resonators 6a, 6b, 6c, and 7b are respectively provided, are illustrated.

On the piezoelectric substrate 2, there are provided electrode lands 8a, 8b, 8c and 8d, in addition to the above-mentioned IDT electrodes 3. Note that in FIG. 2, positions at which a plurality of solder bumps 16a and 16b are located and mounted on the first support 11 are each indicated by a dotted circle.

Electrodes of the functional portions such as the IDT electrodes 3 are each made of an appropriate metal or alloy. In the present preferred embodiment, a multilayer metal film formed by laminating an AlCu film on a Ti film is preferably used. The IDT electrode 3 is electrically connected to the electrode land 8a by distribution wiring (not shown). The distribution wiring and the electrode lands 8a to 8d have a structure in which, on the multilayer metal film formed by laminating the AlCu film on the Ti film, a Ti film and an Al film are further laminated, for example. Note that, however, the material of the distribution wiring and the electrode lands 8a to 8d may be another appropriate metal or alloy.

The IDT electrodes 3, the electrode lands 8a and 8b, and so on can be formed by using a photolithography method or the like, for example.

In the surface acoustic wave resonators 6a to 6c, 7a, and 7b, a hollow portion is provided above the electrodes of the functional portions including the IDT electrodes 3. As such, the first support 11 preferably has a rectangular or substantially rectangular frame shape is provided on the piezoelectric substrate 2. Further, in an inner side region surrounded by the first support 11, a plurality of second supports 12 to 14 are provided. The second supports 12 and 13 preferably have a strip shape in plan view. The second support 12 is provided as a partition wall between the surface acoustic wave resonators 6a and 6b. A lengthwise direction of the second support 12 is a direction parallel or substantially parallel to a propagation direction of the surface acoustic waves of the surface acoustic wave resonators 6a and 6b. Likewise, a lengthwise direction of the second support is a direction parallel or substantially parallel to a propagation direction of the surface acoustic waves of the surface acoustic wave resonators 6b and 6c on both sides thereof.

The lengthwise direction of the second supports 12 and 13 is not limited to a direction parallel or substantially parallel to the propagation direction of the surface acoustic waves of the surface acoustic wave resonators 6a to 6c. However, because the length in the propagation direction of the surface acoustic waves of the surface acoustic wave resonators 6a to 6c is long, it is preferable to provide the second supports 12 and 13 in a direction parallel or substantially parallel to the propagation direction of the surface acoustic waves.

The second support 14 preferably has a crank shape in plan view. This is because the surface acoustic wave resonators 7a and 7b are arranged parallel or substantially parallel to the propagation direction of the surface acoustic waves of the surface acoustic wave resonators 6a, 6b, and 6c. The second support 14 preferably has a crank shape includes a first segment 14a and a third segment 14c extending in a direction parallel or substantially parallel to the propagation direction of the surface acoustic waves of the surface acoustic wave resonators 6a to 6c, 7a, and 7b. An inner side end of the first segment 14a and an inner side end of the third segment 14c are joined by a second segment 14b extending in a direction perpendicular or substantially perpendicular to the propagation direction of the surface acoustic waves. The surface acoustic wave resonator 6c and the surface acoustic wave resonator 7b are separated from each other by the first segment 14a. The surface acoustic wave resonator 7a and the surface acoustic wave resonator 7b are separated from each other by the second segment 14b.

As discussed above, the planar shape of the second support is not limited to a strip shape, and an appropriate planar shape such as a crank shape or the like can be used.

Further, the frame-shaped first support 11 is not limited to the rectangular or substantially rectangular frame shape as long as the hollow portion which the functional portions such as the surface acoustic wave resonators 6a to 6c, 7a, and 7b face can be provided. A circular shape, an elliptical shape, or the like may also be used, for example.

In the present preferred embodiment, the first support and the second supports 12 to 14 are preferably made of synthetic resin. Note that, however, the first support 11 and the second supports 12 to 14 may be made of a material other than synthetic resin, that is, metal, ceramics, or the like, for example.

As shown in FIG. 1, under-bump metal layers 15a and 15b are provided so as to extend through the first support 11 at the portions where the electrode lands 8a and 8b are provided. On the under-bump metal layers 15a and 15b, solder bumps 16a and 16b are provided as bonding members preferably by a print and reflow method for soldering, for example. The bonding member in preferred embodiments of the present invention is not limited to a solder bump, and may be a member made of another metal or a member made of a conductive material such as a mixed material of a resin material and a conductive material.

A cover 17 is able to be bonded to each upper end of the first support 11 and the second supports 12 to 14.

Note that, as shown in FIG. 1, the height of each of the second supports 12 to 14 is higher than the height of the first support 11. In particular, in this preferred embodiment, the second support 13 positioned at the center is the highest, and the second supports 12 and 14 positioned on the first support 11 side are at a level of height between the height of the second support 13 and the height of the first support 11. Because of this, the cover 17 is bent so as to become the highest at the center and become lower in height as it progresses toward the first support 11 side. Note that the heights of the first support 11 and the second supports 12 to 14 are respectively defined as distances from the lower end to the upper end of each of the first support 11 and the second supports 12 to 14 in a normal direction of the first principal surface of the piezoelectric substrate.

Meanwhile, the cover 17 is preferably made of synthetic resin. In the present preferred embodiment, the cover 17 is supported in a state of being bent so as to project upward in the center region as discussed above. More preferably, a tensile stress remains on the upper side of the cover 17. With this, as explained later, deformation in which the cover 17 projects downward due to the pressure at the time of forming a mold resin layer is unlikely to be generated in comparison with the existing techniques. In particular, due to an effect in which the tensile stress on the upper side of the cover 17 cancels out a stress that causes the cover 17 to deform so as to project downward at the time of forming the mold resin layer, the deformation in which the curvature projecting upward is changed to a curvature projecting downward is unlikely to occur.

Moreover, since the heights of the first support 11 and the second supports 12 to 14 are set as discussed above, an area in which the cover 17 makes contact with the mold resin is able to be made larger than in a case where all the supports have the same height. With this, heat dissipation paths are increased so that the heat dissipation properties are able to be effectively improved. This will be further clarified by describing a structure, shown in FIG. 4, in which a module substrate and the mold resin layer are provided.

Figure 4:
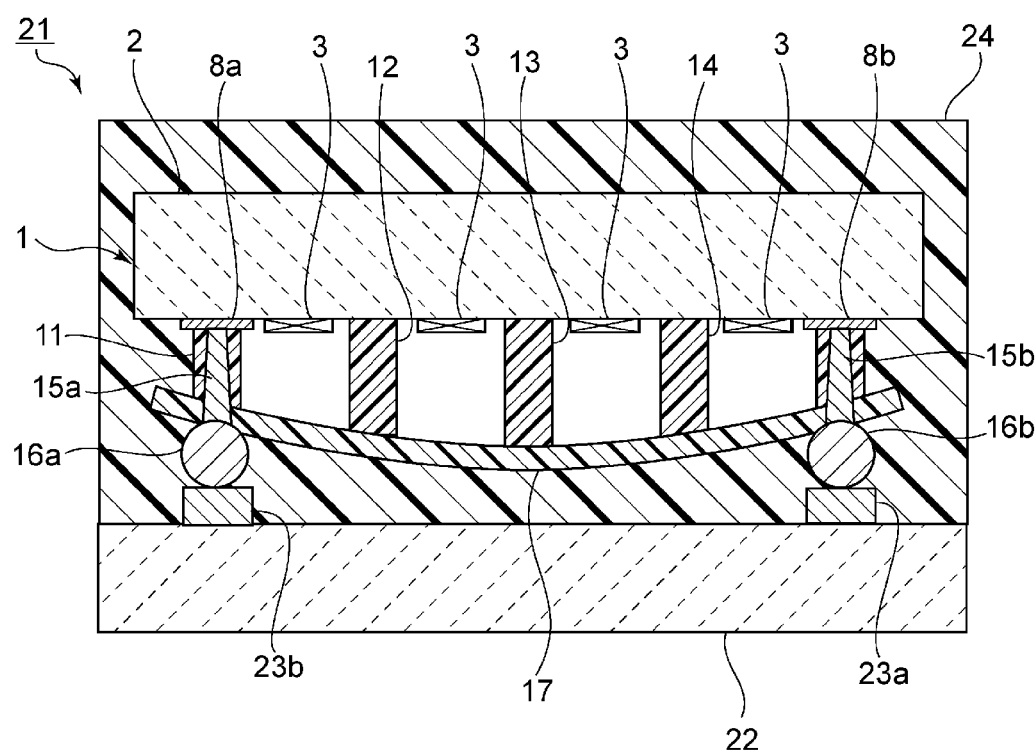
FIG. 4 is a cross-sectional front view illustrating a structure in which the electronic component according to the first preferred embodiment of the present invention is mounted on a module substrate and then a mold resin layer is provided.

A module electronic component 21 shown in FIG. 4 includes a module substrate 22. The module substrate 22 is made of an appropriate insulative material such as alumina or the like. Electrode lands 23a and 23b are provided on one principal surface of the module substrate 22. The electrode lands 23a and 23b are each made of an appropriate metal or alloy. The solder bumps 16b and 16a are bonded to the electrode lands 23a and 23b, respectively, so as to mount the electronic component 1 of the first preferred embodiment on the module substrate 22.

A mold resin layer 24 covers the periphery of the electronic component 1. The mold resin layer 24 seals the sides of the electronic component 1 and fills a portion between the cover and the module substrate 22. Accordingly, in the module electronic component 21, the electronic component 1 inside thereof is able to be protected by the mold resin layer 24. In addition, as discussed above, the contact area between the cover 17 and the mold resin layer 24 is made larger. This increases the heat dissipation paths passing through the mold resin layer 24. As a result, the heat dissipation properties are able to be effectively improved.

At the time of forming the mold resin layer 24, although a pressure by the resin is applied to the cover 17, the deformation of the cover 17 is unlikely to be generated because the tensile force of the cover 17 is large. In addition, the cover 17 is bent at the center side in a direction being distanced from the piezoelectric substrate 2. As such, the cover 17 does not deform largely toward the IDT electrode 3 side even if the pressure is applied thereto. This makes it difficult for the IDT electrode 3 to make contact with the cover 17.

As the synthesis resin of the first support 11 and the second supports 12 to 14, an appropriate thermosetting resin such as polyimide or the like can favorably be used. Preferably, the first support 11 and the second supports 12 to 14 can be formed by a photolithography method using a photosensitive polyimide. A line width of the polyimide in a portion where the first support 11 is provided is thinner than that in a portion inside thereof where the second supports 12 to 14 are provided.

After applying the above-mentioned photosensitive polyimide and carrying out the patterning, heat treatment is carried out in a nitrogen atmosphere at about 300° C. for an hour, for example. Through this, the photosensitive polyimide is cured so that the first support 11 and the second supports 12 to 14 can be formed. Note that, however, the forming method for the first support 11 and the second supports 12 to 14 is not limited thereto.

The synthetic resin of the cover 17 is not limited to any specific one, and a thermosetting resin such as epoxy resin or the like can favorably be used, for example.

The under-bump metal layers 15a, 15b and the solder bumps 16a, 16b may be formed after the cover 17 has been laminated. For example, through-holes passing through the cover 17 and the first support 11 are formed by laser processing. Thereafter, the under-bump metal layers 15a and 15b are formed by a plating growth method or the like. Next, the solder bumps 16a and 16b can be formed on the under-bump metal layers 15a and 15b, respectively, by the print and reflow method for soldering.

In the present preferred embodiment, the height of each of the solder bumps 16a and 16b is higher than the highest position of the cover 17. As such, the mounting on the module substrate or the like is able to be easily carried out from the side of the solder bumps 16a and 16b.

In the present invention, the shapes and arrangement of the cover and the first and second supports are not limited to the above-discussed preferred embodiment. This will be clarified by explaining, as examples, second to ninth preferred embodiments indicated in FIGS. 5 to 12, respectively. It is to be noted that FIGS. 5 to 12 each illustrate a cross-sectional view of the same portion as that illustrated in FIG. 1. Further, the same elements and features as those in the first preferred embodiment are assigned the same reference signs so that the description thereof will be omitted.

In each of FIGS. 5 to 11, a broken line H connecting upper ends of the solder bumps 16a and 16b is drawn. The broken line H makes it easy to compare the height of the upper end of the solder bump with the height of the uppermost portion of the cover.

Figure 5:
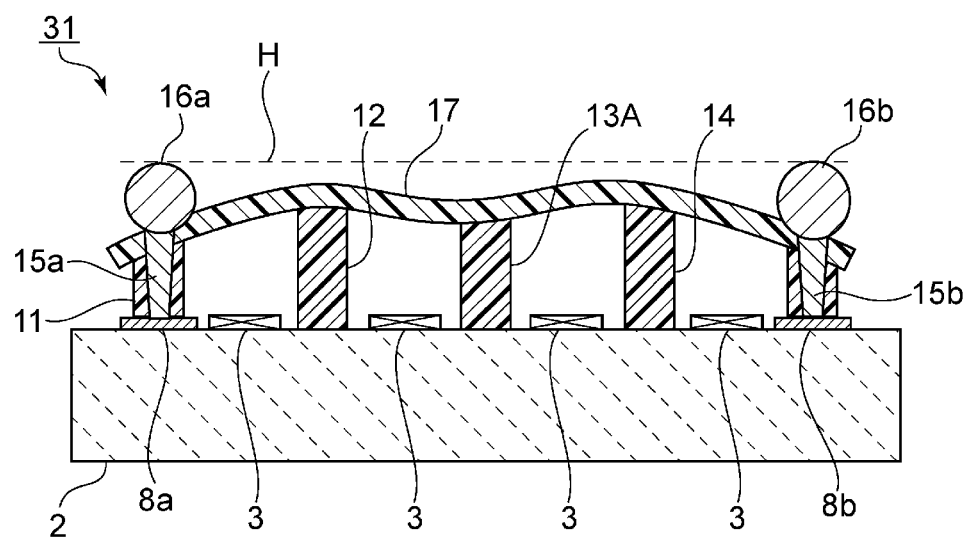
FIG. 5 is a cross-sectional side view of an electronic component according to a second preferred embodiment of the present invention.

In an electronic component 31 of the second preferred embodiment shown in FIG. 5, the height of a second support 13A positioned at the center is lower than the height of the second supports 12 and 14. The height of the second support 13A is higher than the height of the first support 11. In this manner, the second support 13A on the center side may be lower in height than the second support 12 and 14 on the first support 11 side. In this case, the cover 17 is bent so as to project upward at two portions where the second support 12 and the second support 14 are respectively provided. This enhances the tensile force of the cover 17. As such, the tensile force is enhanced and the contact area with the mold resin is able to be made further larger. Because of this, the cover 17 is unlikely to be deformed at the time of forming the mold resin layer and the heat dissipation properties are able to be more effectively improved.

Figure 6:
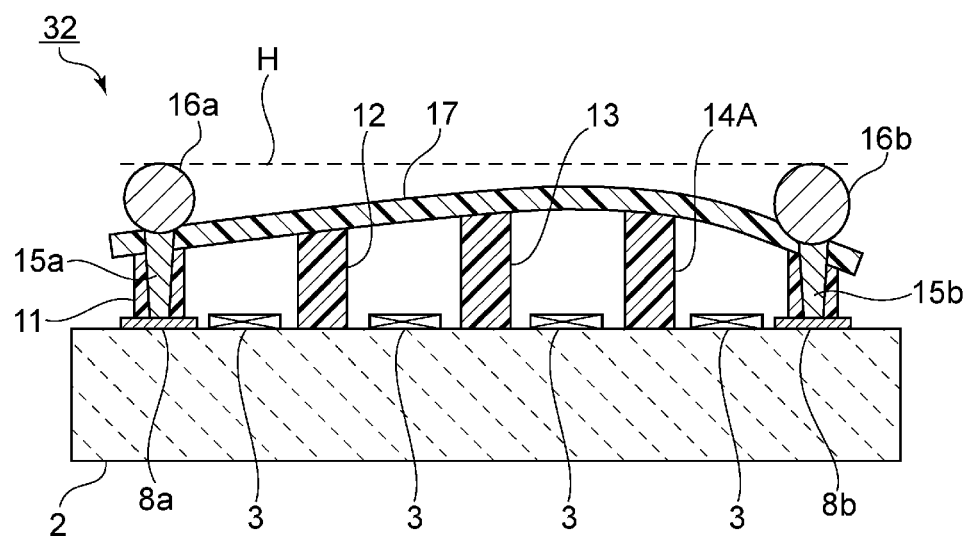
FIG. 6 is a cross-sectional side view of an electronic component according to a third preferred embodiment of the present invention.

In an electronic component 32 of the third preferred embodiment shown in FIG. 6, the height of a second support 14A is higher than the height of the second support 13. In this manner, the height of the second support 14A immediately inside of the first support 11 may be made higher than the height of the second support 13 on the center side. Other elements and features of the electronic component 32 are the same as those of the electronic component 1.

Figure 7:
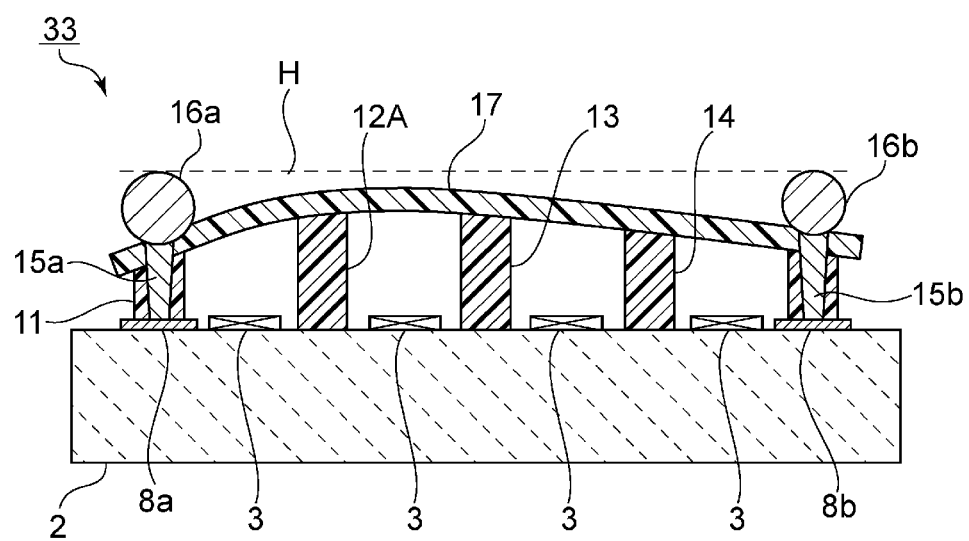
FIG. 7 is a cross-sectional side view of an electronic component according to a fourth preferred embodiment of the present invention.

Like an electronic component 33 of the fourth preferred embodiment as shown in FIG. 7, the height of a second support 12A may be made higher than the height of the second support 13 on the center side.

Like the electronic components 32 and 33, the heights of the second support 14A and the second support 12A positioned on the first support 11 side may be made to be the highest compared to the second support 13 on the center side.

Figure 8:
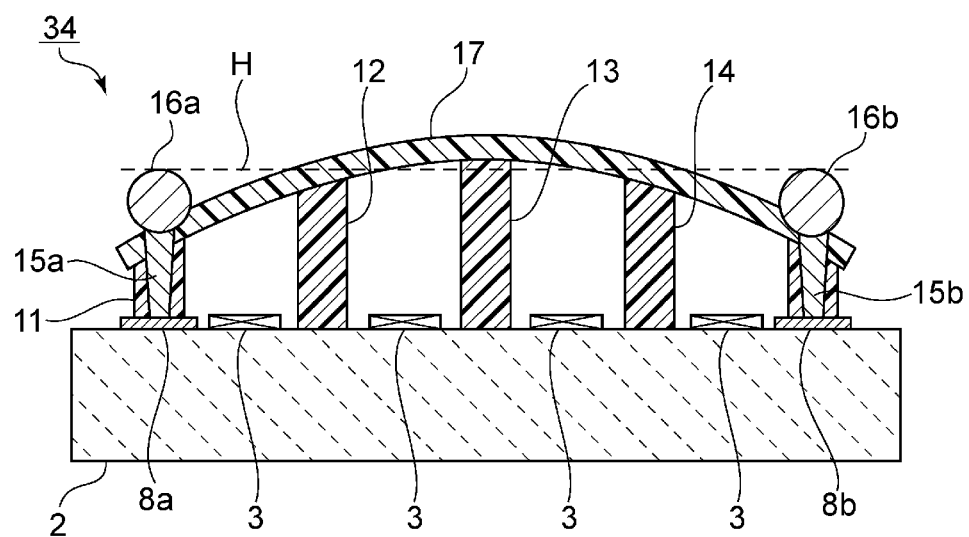
FIG. 8 is a cross-sectional side view of an electronic component according to a fifth preferred embodiment of the present invention.

FIG. 8 is a cross-sectional side view of an electronic component 34 according to the fifth preferred embodiment. In the electronic component 34, the cover 17 projects in a direction being distanced from the piezoelectric substrate 2 in the center region like in the electronic component 1. In other words, the second support 13 is higher than the second supports 12 and 14 on both sides thereof. Further, the second supports 12 to 14 are higher than the first support 11. Note that, however, in the electronic component 34, the uppermost portion of the cover 17 is higher than the upper ends of the solder bumps 16a and 16b. In other words, the second supports 12 to 14 are made to be higher than the first support 11 so that the uppermost portion of the cover 17 becomes higher than the upper ends of the solder bumps 16a and 16b. As discussed above, the upper end of each of the solder bumps 16a and 16b may be lower in height than the uppermost portion of the cover 17. Even in such case, it is sufficient for the height of the electrode lands provided on the module substrate 22 to be high when mounted on the module substrate.

Figure 9:
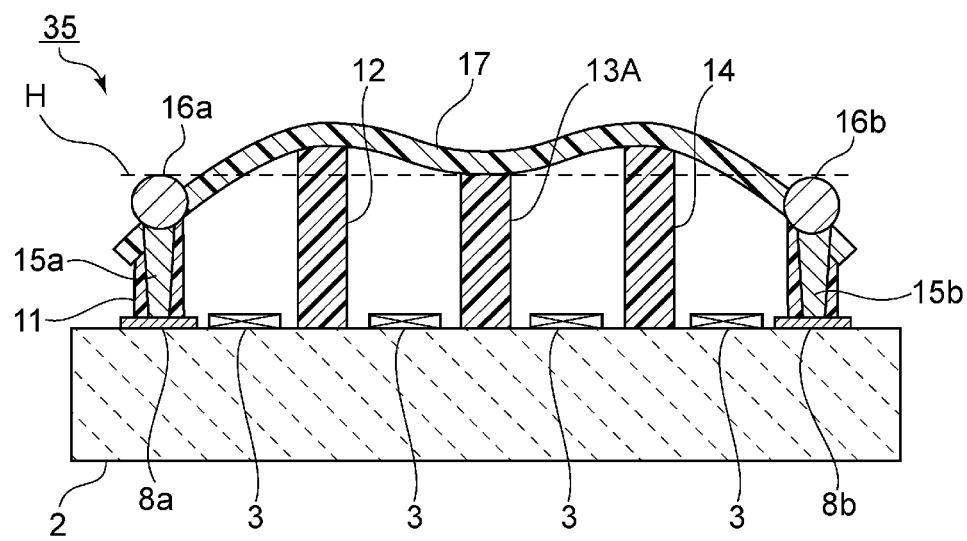
FIG. 9 is a cross-sectional side view of an electronic component according to a sixth preferred embodiment of the present invention.

Also in an electronic component 35 according to the sixth preferred embodiment shown in FIG. 9, the uppermost portion of the cover 17 is higher than the upper ends of the solder bumps 16a and 16b, like in the electronic component 34. In the electronic component 35, like in the electronic component 31, the second support 13A at the center is lower in height than the second supports 12 and 14 on both sides thereof.

Figure 10:
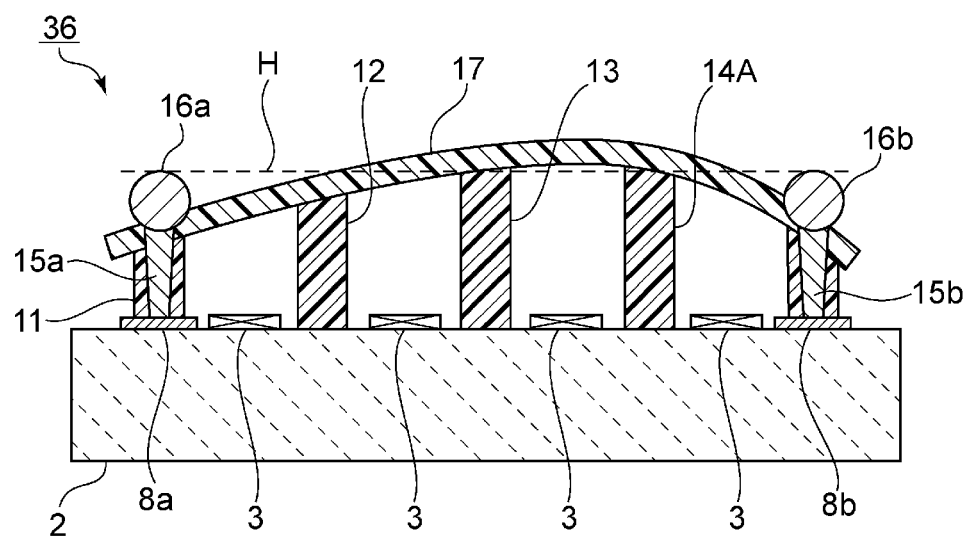
FIG. 10 is a cross-sectional side view of an electronic component according to a seventh preferred embodiment of the present invention.
Figure 11:
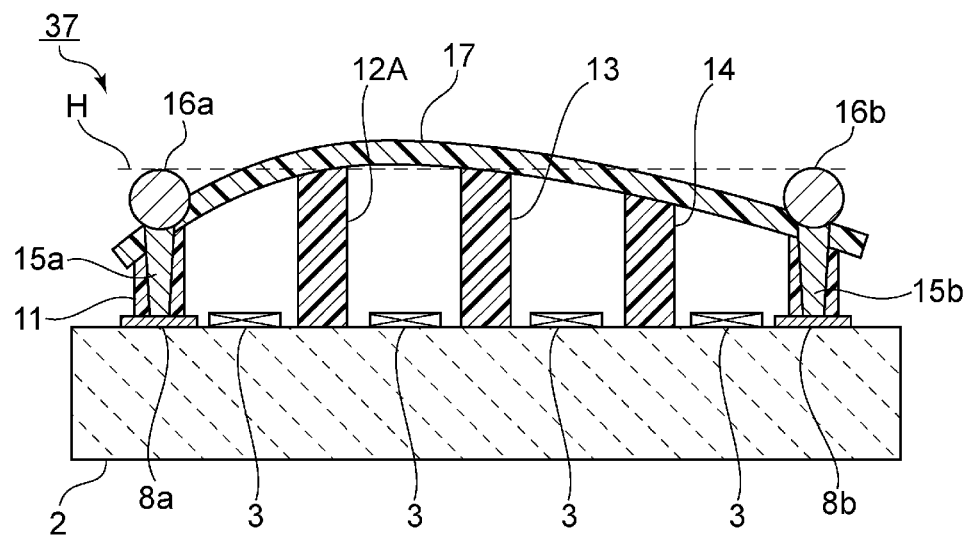
FIG. 11 is a cross-sectional side view of an electronic component according to an eighth preferred embodiment of the present invention.

In an electronic component 36 according to the seventh preferred embodiment shown in FIG. 10, the second support 14A is higher than the second support 13. In an electronic component 37 according to the eighth preferred embodiment shown in FIG. 11, the height of the second support 12A is equal or substantially equal to the height of the second support 13. In the electronic components 36 and 37, like in the electronic component 34, the uppermost portion of the cover 17 is made to be higher than the upper ends of the solder bumps 16a and 16b. Further, in the electronic components 36 and 37, the uppermost portion of the cover 17 does not correspond to a portion where the second support 13 at the center is provided, but corresponds to a portion where the second support 14A or 12A positioned immediately inside of the first support 11 is provided.

Figure 12:
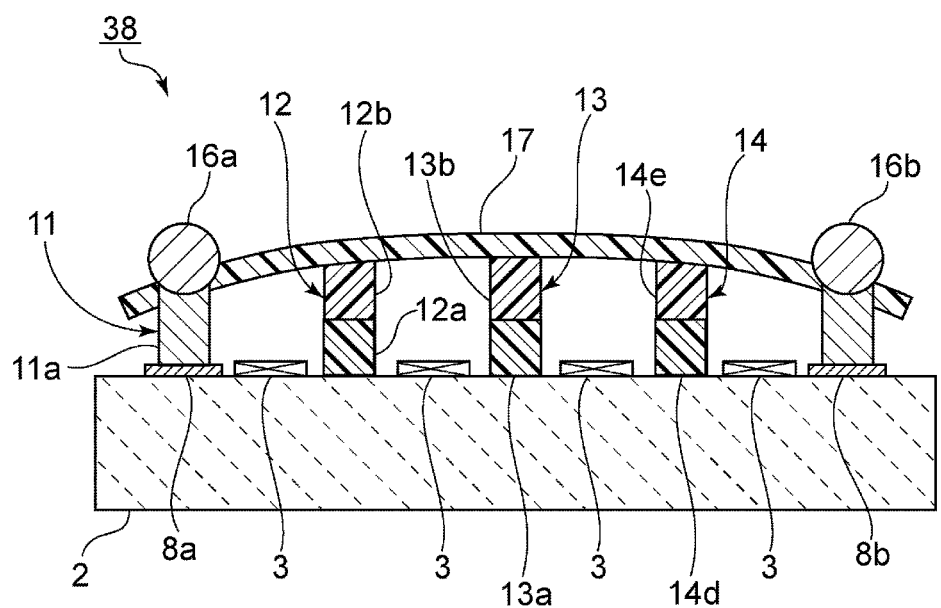
FIG. 12 is a cross-sectional side view of an electronic component according to a ninth preferred embodiment of the present invention.

In an electronic component 38 according to the ninth preferred embodiment shown in FIG. 12, in the sections where the solder bumps 16a and 16b are provided, a portion of the first support 11 under the solder bumps 16a and 16b is made of metal. In the cross section shown in FIG. 12, a support portion 11a made of metal is provided in order to electrically connect the solder bumps 16a and 16b. In this case, strength in support of the cover 17 by the first support 11 can be enhanced. Note that the first support 11 preferably has a frame shape, and not the entirety of the frame shape is made of metal. The remaining portion, that is, a portion made of an insulative material, is bonded to the support portion 11a positioned under the sections where the solder bumps 16a and 16b are provided, thus defining the first support 11. Note that, however, the entirety of the first support 11 may be made of metal.

As discussed above, the first support 11 may be made of a different material from the material of the second supports 12 to 14.

However, it is preferable that the first support 11 and the second supports 12 to 14 be made of the same material. This makes it possible to realize reduction in the cost and simplification in the process.

In place of the solder bumps 16a and 16b, metal bumps made of another metal such as Au or the like may be used.

Further, like the second supports 12 to 14 as shown in FIG. 12, the second supports may have structures in which a plurality of material layers 12a, 12b, 13a, 13b, 14d, and 14e are laminated. This makes it possible to adjust the strength of the second supports 12 to 14.

According to the above-described preferred embodiments, the surface acoustic wave resonators including the IDT electrodes are provided. In preferred embodiments of the present invention, the above-discussed functional portion is not limited to the surface acoustic wave resonator, and may be another type of surface acoustic wave resonator, a surface acoustic wave filter, or the like. In addition, it is sufficient for the functional portion to be a functional portion that includes a hollow portion, and the functional portion is not limited to a structure in which an elastic wave element is provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a piezoelectric substrate;
   an electrode that is provided on the piezoelectric substrate and defines a functional portion;
   a first support including a frame shape and provided on the piezoelectric substrate so as to define a hollow portion which the functional portion faces;
   a second support provided on the piezoelectric substrate in an inner side region surrounded by the first support; and
   a cover that is laminated on the first and second supports and defines the hollow portion; wherein
   a height of the second support is higher than a height of the first support.

2. The electronic component according to claim 1, wherein a plurality of the second supports are provided.

3. The electronic component according to claim 2, wherein heights of the plurality of second supports are equal or substantially equal to one another.

4. The electronic component according to claim 2, wherein the height of at least one of the second supports is different from the height of each of the other second supports.

5. The electronic component according to claim 1, wherein at least one of the second supports includes a plurality of material layers.

6. The electronic component according to claim 1, wherein at least a portion of the first support is made of metal.

7. The electronic component according to claim 1, further including a bonding member provided on the first support.

8. The electronic component according to claim 7, wherein a height of an uppermost portion of the cover is lower than a height of an upper end of the bonding member.

9. The electronic component according to claim 7, wherein the height of the uppermost portion of the cover is higher than the height of the upper end of the bonding member.

10. The electronic component according to claim 1, wherein the first support and the second support are made of different materials from each other.

11. The electronic component according to claim 1, wherein at least one IDT electrode is provided in the functional portion to define a surface acoustic wave device.

12. The electronic component according to claim 1, further comprising reflectors provided on the piezoelectric substrate, wherein the electrode provided on the piezoelectric substrate includes a plurality of interdigital transducer electrodes located between the reflectors.

13. The electronic component according to claim 1, further comprising electrode lands provided on the piezoelectric substrate.

14. The electronic component according to claim 1, wherein the functional portion includes a plurality of surface acoustic wave resonators.

15. The electronic component according to claim 1, wherein the second support has a strip shape or crank shape in the plan view.

16. The electronic component according to claim 1, wherein the frame shape of the first support is one of a rectangular shape, a substantially rectangular shape, a circular shape, a substantially circular shape, an elliptical shape and a substantially elliptical shape.

17. The electronic component according to claim 1, further comprising under-bump metal layers extending through the first support.

18. The electronic component according to claim 17, further comprising solder bumps disposed on the under-bump metal layers.

19. The electronic component according to claim 18, wherein a height of each of the solder bumps is greater than a highest portion of the cover.

20. The electronic component according to claim 1, wherein the second support includes a laminate including a plurality of material layers.

* * * * *